(12) United States Patent
Koh et al.

(10) Patent No.: US 7,485,349 B2
(45) Date of Patent: *Feb. 3, 2009

(54) THIN FILM FORMING METHOD

(75) Inventors: Won-Yong Koh, Taejon (KR); Chun-soo Lee, Taejon (KR)

(73) Assignee: ASM Genitech Korea Ltd. (KR)

( * ) Notice: Subject to any disclaimer, the term of this patent is extended or adjusted under 35 U.S.C. 154(b) by 178 days.

This patent is subject to a terminal disclaimer.

(21) Appl. No.: 11/552,898

(22) Filed: Oct. 25, 2006

(65) Prior Publication Data

US 2007/0048455 A1 Mar. 1, 2007

Related U.S. Application Data

(63) Continuation of application No. 10/297,867, filed as application No. PCT/KR01/00974 on Jun. 8, 2001, now Pat. No. 7,141,278.

(30) Foreign Application Priority Data

Jun. 8, 2000 (KR) ............... 2000-31367
Jan. 26, 2001 (KR) ............... 2001-3830

(51) Int. Cl.
*H05H 1/24* (2006.01)

(52) U.S. Cl. ............... 427/569; 427/579; 427/255.29; 117/92; 117/103; 117/108

(58) Field of Classification Search ............... 427/576, 427/579, 255.29; 117/92, 103, 108
See application file for complete search history.

(56) References Cited

U.S. PATENT DOCUMENTS

| 4,058,430 A | 11/1977 | Suntola et al. |
| 4,389,973 A | 6/1983 | Suntola et al. |
| 4,675,089 A | 6/1987 | Lory et al. |
| 4,767,494 A | 8/1988 | Kobayashi |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |

(Continued)

FOREIGN PATENT DOCUMENTS

JP          1-305524 A          12/1989

(Continued)

OTHER PUBLICATIONS

Lee, Yong Ju, "Low-impurity, highly conformal atomic layer deposition of titanium nitride using NH3-Ar-H2 plasma treatment for capacitor electrodes". Materials Letters, vol. 59, Issue 6, Mar. 2005, pp. 615-617.*

(Continued)

*Primary Examiner*—Bret Chen
(74) *Attorney, Agent, or Firm*—Knobbe Martens Olson & Bear LLP

(57) ABSTRACT

A method for forming thin films of a semiconductor device is provided. The thin film formation method presented here is based upon a time-divisional process gas supply in a chemical vapor deposition (CVD) method, where the process gases are supplied and purged sequentially, and additionally plasma is generated in synchronization with the cycle of pulsing reactant gases. A method of forming thin films that possess a property of gradient composition profile is also presented.

39 Claims, 4 Drawing Sheets

U.S. PATENT DOCUMENTS

| | | | |
|---|---|---|---|
| 5,225,366 A | 7/1993 | Yoder | |
| 5,270,247 A | 12/1993 | Sakuma et al. | |
| 5,281,274 A | 1/1994 | Yoder | |
| 5,356,673 A | 10/1994 | Schmitt et al. | |
| 5,370,738 A | 12/1994 | Watanabe et al. | |
| 5,374,570 A | 12/1994 | Nasu | |
| 5,395,791 A | 3/1995 | Cheng | |
| 5,443,647 A | 8/1995 | Aucoin et al. | |
| 5,483,919 A | 1/1996 | Yokoyama et al. | |
| 5,521,126 A | 5/1996 | Okamura et al. | |
| 5,711,811 A | 1/1998 | Suntola et al. | |
| 5,769,950 A | 6/1998 | Takasu et al. | |
| 5,855,680 A | 1/1999 | Soininen et al. | |
| 5,916,365 A | 6/1999 | Sherman | |
| 5,972,430 A | 10/1999 | DiMeo, Jr. et al. | |
| 6,139,700 A | 10/2000 | Kang et al. | |
| 6,200,893 B1 * | 3/2001 | Sneh | 438/685 |
| 6,203,613 B1 | 3/2001 | Gates et al. | |
| 6,270,572 B1 | 8/2001 | Kim et al. | |
| 6,342,277 B1 | 1/2002 | Sherman | |
| 6,391,803 B1 | 5/2002 | Kim et al. | |
| 6,416,822 B1 | 7/2002 | Chiang et al. | |
| 6,482,740 B2 * | 11/2002 | Soininen et al. | 438/686 |
| 6,503,330 B1 | 1/2003 | Sneh et al. | |
| 6,511,539 B1 | 1/2003 | Raiijmakers | |
| 6,534,395 B2 | 3/2003 | Werkhoven et al. | |
| 6,723,642 B1 | 4/2004 | Lim et al. | |
| 6,730,164 B2 * | 5/2004 | Vaartstra et al. | 117/104 |
| 6,752,869 B2 | 6/2004 | Lee et al. | |
| 6,818,783 B2 * | 11/2004 | Norman et al. | 556/112 |
| 6,838,215 B2 * | 1/2005 | Imura | 430/5 |
| 6,846,516 B2 * | 1/2005 | Yang et al. | 427/255.32 |
| 6,958,302 B2 * | 10/2005 | Ahn et al. | 438/785 |
| 7,141,278 B2 * | 11/2006 | Koh et al. | 427/576 |

FOREIGN PATENT DOCUMENTS

| | | |
|---|---|---|
| KR | P2000-0003455 | 1/2000 |
| KR | P2000-0049298 | 8/2000 |
| KR | P2000-0060332 | 10/2000 |
| WO | WO 00/54320 | 9/2000 |

OTHER PUBLICATIONS

De Keijser et al., "Atomic layer epitaxy of gallium arsenide with the use of atomic hydrogen," Appl. Phys. Lett., 1991, pp. 1187, vol. 58.

English language abstract of Korea Published Application No. KR P2000-0003455, Jan. 15, 2000.

English language abstract of Korea Published Application No. KR P2000-0049298, Aug. 5, 2000.

English language abstract of Korea Published Application No. KR P2000-0060332, Oct. 16, 2000.

Supplementary Partial European Search Report for counterpart EP Application No. 01937028, no date available.

Autran et al. "Conduction properties of amorphous $Ta_2O_5$ films prepared by plasma enhanced chemical vapour deposition", *Sensors and Actuators*, vol. A 51, No. 1, p. 5-8 (Oct. 1995).

Laviale et al. "Low pressure microwave electron cyclotron resonance plasma deposition of amorphous $Ta_2O_5$ films," *Appl. Phys. Lett.*, vol. 65 (16), p. 2021-2023, (Oct. 17, 1994).

Cho et al., "Remote plasma-assisted metal organic chemical vapor deposition of tantalum nitride thin films with different radicals", *Jpn. P. Appl/ Phys.* vol. 37, pp. 6502-6505 (1998).

Hiramatsu et al., "Formation of TiN films with low CI concentration by pulsed plasma chemical vapor deposition", XP000620566, pp. 1037-1040, no date available.

Moon et al., "Erratum effect of deposition temperature on dielectric properties of PECVD $Ta_2O_5$ thin film", *Journal of Materials Science*, vol. 29, pp. 3372-3375 (1994).

Supplementary European Search Report dated Nov. 20, 2007 in counterpart European Application No. 01 93 7028.7-2122 PCT/KR0100974.

* cited by examiner

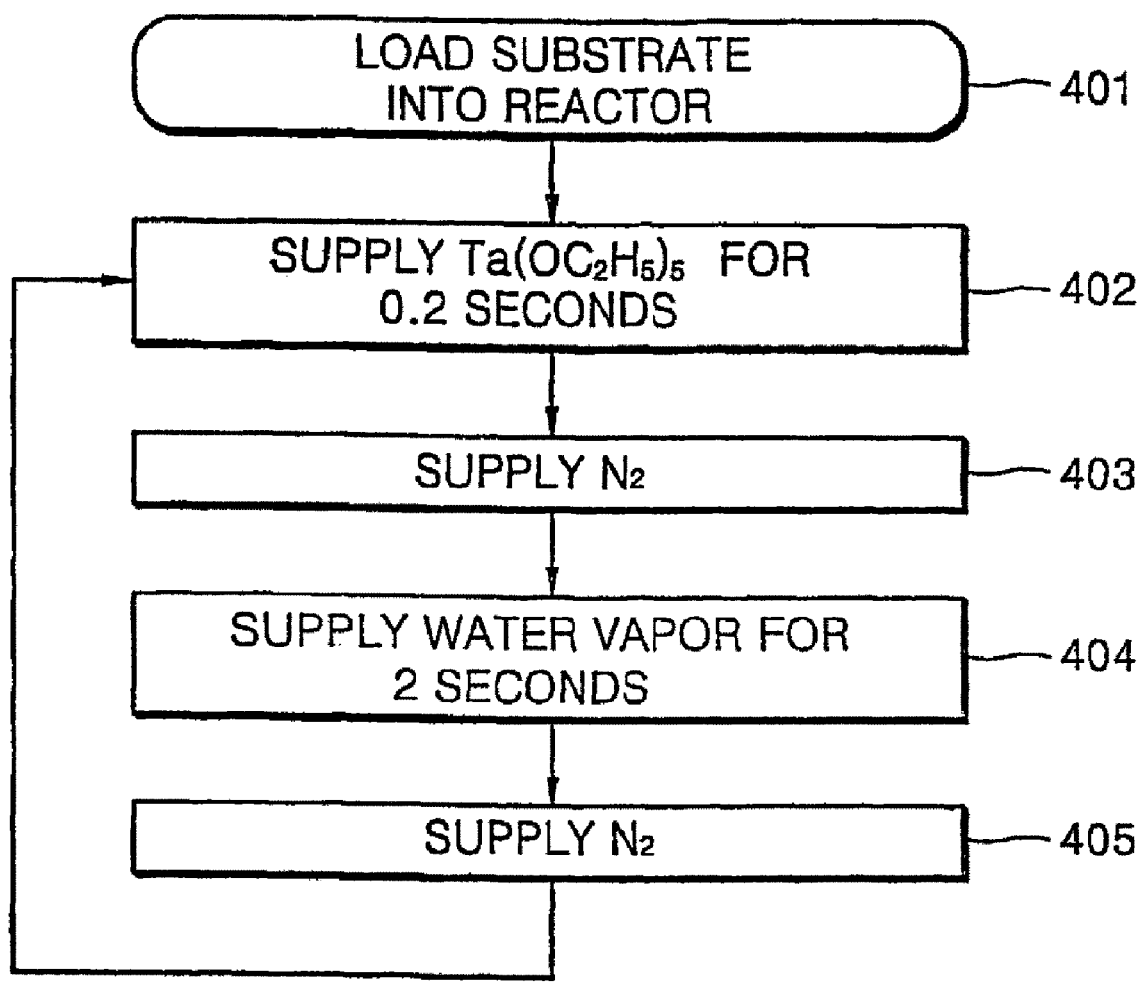

THIN FILM FORMING METHOD

CROSS-REFERENCE TO RELATED APPLICATIONS

This application is a continuation of U.S. patent application Ser. No. 10/297,867, filed Jul. 15, 2003, now U.S. Pat. No. 7,141,278, issued Nov. 28, 2006, entitled "THIN FILM FORMING METHOD," which is the national phase application of PCT/KR01/00974, filed Jun. 8, 2001, and claims priority from Korean Application No. 2000-31367 filed Jun. 8, 2000; and Korean Application No. 2001-3830 filed Jan. 26, 2001, which are incorporated herein by reference.

BACKGROUND OF THE INVENTION

1. Field of the Invention

The present invention relates to a thin film formation method, and more particularly, to a method for forming a metal film, a metal oxide film or a metal nitride film that can be used as an insulating layer, a dielectric layer, or an interconnect layer in a semiconductor or flat-panel display substrate.

2. Description of the Related Art

In the prior art, a metal film, a metal oxide film, or a metal nitride film have been formed by means of a physical vapor deposition (PVD) method such as sputtering. However, PVD is known to have poor step coverage and produce a non-even surface due to an overhang phenomenon where the opening of a hole or a trench is closed before the hole or trench are fully filled. For these reasons, chemical vapor deposition (CVD) methods that form a layer having a relatively uniform thickness with good step coverage has been widely used in recent years.

However, for the conventional CVD technique, the source materials required to form a layer are supplied at the same time, and therefore it is difficult to form a target layer having a desired composition and property. In addition, reaction of a variety of materials used to form a layer occurs in the gas phase, thereby causing the generation of contamination particles. When a multicomponent metal oxide such as barium titanate ($BaTiO_3$) or barium strontium titanate (($Ba,Sr)TiO_3$) is deposited by CVD, the metals react with each other. As a result, it becomes difficult to form a layer having a uniform composition over a large area on the surface of a 300-mm wafer. In case of a CVD process where an organometallic compound is used as a source material, a large number of carbonic impurities are generated in the resulting film by raising the temperature of the substrate in order to increase the rate of film formation.

As a method of forming a thin film using a chemical compound material, an atomic layer deposition (ALD) method in which reactant gases containing the respective atoms of the compound are sequentially supplied is disclosed in U.S. Pat. Nos. 4,058,430 and 4,389,973 issued to Suntola et al. in 1977. According to the ALD method, the thickness of a layer formed on a substrate by the absorption of reactant gases is almost constant regardless of the duration of reactant gas supply. Thus, the thickness and composition of a target layer can be accurately adjusted by varying the number of pulsing cycles of the source gases. However, ALD methods require separate pulses of reactant gases containing respective constituent elements. Therefore, when a multicomponent metal oxide film is formed by ALD, the thin film formation process become complicated, and a complex manufacturing apparatus is required.

In order to solve the problems arising from using conventional CVD and ALD methods, a new method is disclosed in U.S. Pat. No. 5,972,430 issued to Dimeo in 1999. According to this method, the precursors containing the respective constituent metal elements of a target layer are simultaneously supplied into a reactor to form a precursor layer, and the reactor is purged with an inert gas. Next, all the metal atoms of the precursor layer are oxidized by an oxidizing agent, thereby resulting in a multicomponent metal oxide layer. Then, the reactor is purged again with an inert gas. This process cycle is repeated in order to complete the film formation. However, simultaneous supply of the precursors containing the respective constituent metal atoms in this method causes reaction between the constituent metal atoms, thereby lowering the vapor pressure. Precursors having low vapor pressure, such as $Ba(thd)_2$ or $TaCl_5$, are easily changed from a gas phase to a solid phase as the temperature-drops. This phase transition occurs easily when vaporized precursors are in transit states of being supplied into an ALD reactor. In addition, during the phase transition from vapor to solid, particles are easily generated during each transition going from a vapor state to a solid state. Once particles are generated, removing as well as handling of such particles is very difficult. $Ba(thd)_2$ and $Sr(thd)_2$, which are Ba and Sr precursors, respectively, react with an alkyl group precursor to form a compound having a low vapor pressure, which is difficult to handle. Here, the abbreviation "thd" stands for tetramethyl-heptanedionate $((CH_3)_3CC(O)CHC(O)C(CH_3)_3)$.

ALD methods, in which source gases containing the respective atoms constituting a target layer are separately supplied, can prevent reaction between the constituent atoms. However, when an organometallic compound is used as a precursor, the temperature of a substrate should be kept lower than the temperature of the organometallic compound because an organometallic compound is easily decomposed by itself at a high temperature, and easily form a solid state. Furthermore, if the temperature of the substrate is too low, the target layer cannot be formed because a desired reaction does not occur between supplied source gases. Thus, there is a need to maintain the substrate at a temperature greater than a minimal temperature at which formation of the target layer is caused. The range of minimum and maximum reaction temperatures of a substrate for ALD methods is varied depending on source materials. To form a multi-atomic layer by ALD, source materials containing the respective constituent atoms of the multi-atomic layer should have an overlapping range of minimum and maximum reaction temperatures. If a target layer is composed of many kinds of atoms so that there is no overlapping range of reaction temperatures between the constituent atoms, ALD methods cannot be applied to form the target layer. In addition, it is impossible to deposit a pure metal layer such as a Ti, W, or Al layer at a temperature lower than the thermal decomposition temperature of the metal layer by conventional ALD methods.

To form a layer with source materials having low reactivity, U.S. Pat. No. 5,916,365 to Sherman et al. discloses a thin film formations method involving supplying a first reactant gas into a reactor, exhausting the remaining first reactant gas from the reactor with a vacuum pump, supplying a second reactant gas which is activated passing through a radical generator such as a radio frequency (RF) power supply unit, and exhausting the remaining second reactant gas from the reactor with the vacuum pump. However, the pumping rate of the vacuum pump decreases as the pressure in the reactor decreases. Thus, it takes a considerable amount of time to fully exhaust the remaining reactant gas from the reactor.

To solve such problem, Korean Patent Application No. 99-11877 discloses a method of forming a thin film by generating plasma in synchronization with cyclic operation processes, which is incorporated herein by reference. The cyclic operation processes involve supplying a reactant gas, exhausting the remaining reactant gas from the reactor with a purge gas, supplying another reactant gas, and purging the reactor with a purge gas. Exhausting the remaining reactant gas using a purge gas is faster than using a vacuum pump. Thus, the method of Korean Patent Application No. 99-11877 can shorten the gas supply time with an improved film growth rate, compared to the method disclosed in U.S. Pat. No. 5,916,365. When plasma is directly generated in a reactor for a faster reaction rate, the method by Sherman et al. causes a serious change in gas pressure of the reactor, thereby destabilizing plasma. However, use of a purge gas can maintain the pressure of the reactor constant, thereby enabling stable plasma generation. In addition, to supply a solid material such as a barium (Ba) source used in the formation of a barium titanate layer at a constant rate, a liquid source supply unit for supplying a solution in which a solid material is dissolved in a solvent, and a vaporizer for converting a liquid source material to a gaseous form, are used. In this case, the method by Sherman et al. leads to clogging of the liquid source supply unit. In particular, when the reaction chamber is evacuated with a vacuum pump to purge a gaseous material that remains after reaction induced by supplying a reaction source, a highly volatile solvent rapidly evaporates near the supply line of the liquid source connected to the vaporizer. As a result, a viscous solid material remains in the liquid source supply unit and clogs the supply line of the liquid source. In contrast, the method disclosed in Korean Patent Application No. 99-11877 does not cause such a problem because the pressure of the reactor and the vaporizer is maintained at a constant level.

SUMMARY OF THE INVENTION

It is an object of the present invention to provide a method of for forming a metal layer, a metal oxide layer, or a metal nitride layer on a semiconductor or flat-panel display substrate with superior characteristics by chemical vapor deposition (CVD) in which a time-divisional sequentially-pulsed source supply technique is used along with plasma in synchronization with the sequentially pulsed source supply cycle.

In the present invention, a radio-frequency (RF) power of 0.01-2.0 W/cm$^2$ is applied as pulses for plasma generation in synchronization with the cycle of pulsing reactant gases. Here, RF power means a maximum power level upon the application of power pulse. The plasma generation may be continuous rather than pulsed. When an atomic layer deposition (ALD) method using plasma is applied, the minimum reaction temperature at which source materials can be deposited into a layer is lowered. As a result, the range of reaction temperature at which a layer can be formed by ALD, from the maximum temperature to the minimum temperature, becomes broader. Therefore, although the ALD method is applied with many kinds of atoms to form a multi-atomic layer, an overlapping reaction temperature range between the atoms exists, thereby enabling formation of the multi-atomic layer by ALD. In other words, ALD using plasma (hereinafter, "plasma ALD") is less limited in the range of minimum and maximum reaction temperatures, and thus selection of metallic source materials is also less limited, compared to a general ALD method not using plasma. In addition, when a pure metal layer is deposited using Al, Ti, or W, plasma serves as an activation energy source so that an atomic layer can be deposited at a temperature lower than the thermal decomposition temperature of the source material. The physical and chemical properties of the resultant layer can be varied and improved by changing the level of RF power pulses applied to generate plasma.

According to the present invention, the step of generating plasma can be carried out after each cycle of pulsing reactant gases, or after several cycles of pulsing reactant gases. For example, a TiN layer with improved characteristics can be formed by pulsing reactant gases and generating plasma in the following sequence:

[(Ti→N)→(N or H plasma)]

or

[{(Ti→N)}$_{n\ cycles}$→(N or H plasma)].

Here, to prevent unnecessary pre-reaction between source materials, the reactor is purged with a purge gas before and after each supply of source materials.

According to the present invention, by using the source materials that do not react with each other when the plasma is absent, the pulsing step of the reactor with a purge gas between each supply of source materials can be omitted. For example, oxygen gas (O$_2$) slowly reacts with a metallic compound at low temperatures, whereas oxygen plasma easily reacts with a metallic compound to form a metal oxide. In this case, a metal oxide layer can be formed without using a purge gas by pulsing materials in the following sequence:

[(metallic source)→oxygen gas→(oxygen plasma)→].

As a result, the deposition rate of the metal oxide layer is improved, compared to the method using a purge gas. As another example, a metal nitride layer can be formed using nitrogen gas (N$_2$) and hydrogen gas (H$_2$) which do not react with a metallic source, by pulsing materials in the following sequence:

[(metallic source)→(nitrogen gas+hydrogen gas)→(nitrogen and hydrogen plasma)→].

In this case, the metal oxide layer is deposited at a higher rate, compared to the method using a purge gas. A metal nitride layer can be formed by generating ammonia (NH$_3$) plasma in a reactor, instead of using nitrogen gas (N$_2$) and hydrogen gas (H$_2$). However, the use of nitrogen gas (N$_2$) and hydrogen gas (H$_2$) is advantageous in that a purge gas is not used during the processing cycle for the metal nitride layer. According to the present invention, a pure metal layer of Ti, Al, or W can be formed at low temperatures by repeating the following cycle:

[(metallic source)→hydrogen gas→(hydrogen plasma)→].

According to the present invention, oxygen gas, hydrogen gas, and a mixture of nitrogen and hydrogen can be mixed with an inert gas such as helium (He) or argon (Ar) to be used as a purge gas for improved purging effects. The addition of an inert gas also allows reactivity to be controlled by varying the concentration of reactant gas.

BRIEF DESCRIPTION OF THE DRAWINGS

The above objects and advantages of the present invention will become more apparent by describing in detail preferred embodiments thereof with reference to the attached drawings in which:

FIG. 4 is a flowchart illustrating a conventional method for forming a tantalum oxide ($Ta_2O_5$) layer, as a comparative example to the second embodiment of the ALD method according to the present invention.

DETAILED DESCRIPTION OF THE PREFERRED EMBODIMENT

The present invention now will be described more fully and in detail with reference to the accompanying drawings by providing preferred embodiments as described below.

Embodiment 1

Figure 1:
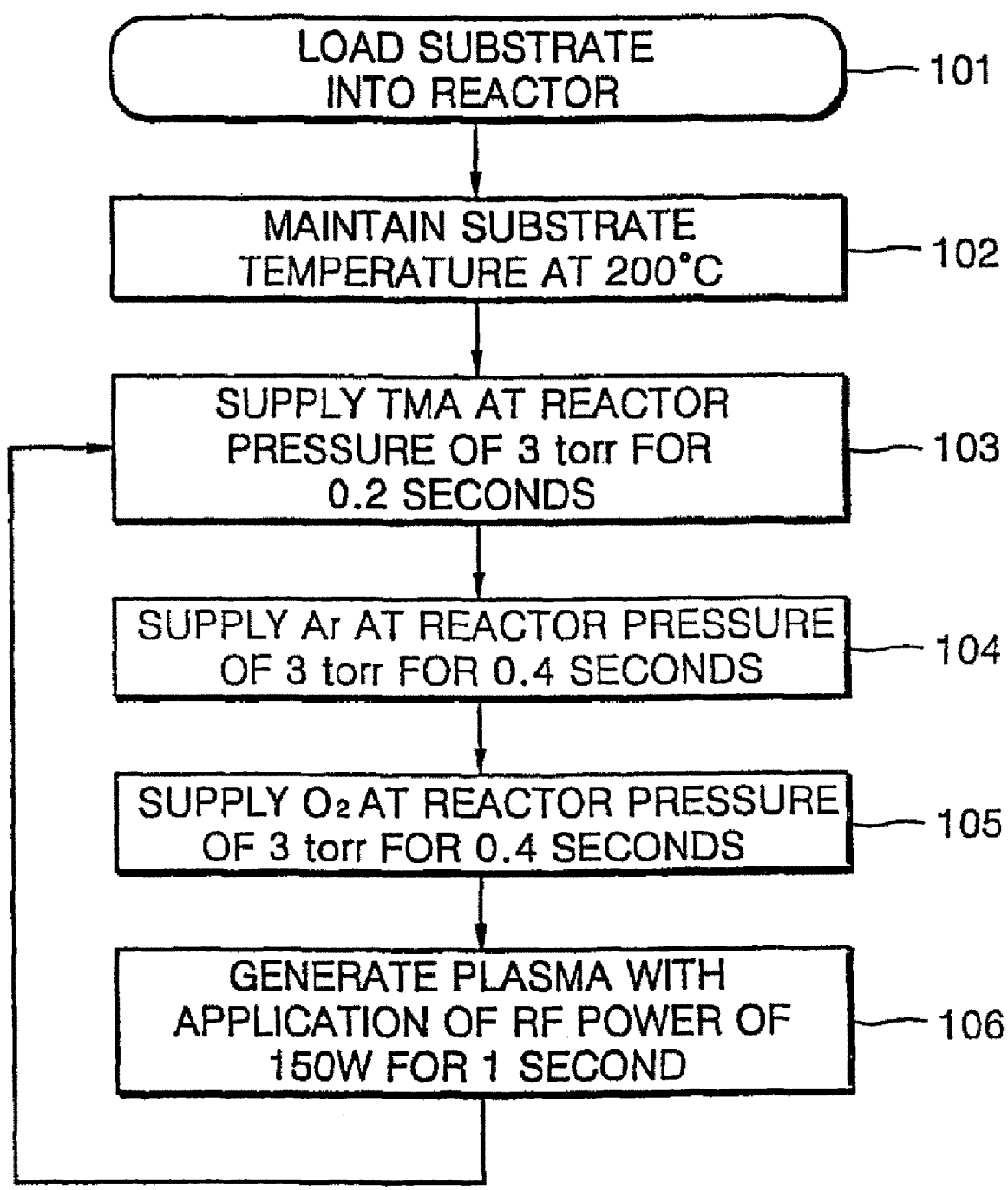
FIG. 1 is a flowchart illustrating an atomic layer deposition (ALD) method for forming a metal oxide layer according to a first preferred embodiment of the present invention.

Oxygen gas ($O_2$) reacts slowly with an organometallic source material so that it is difficult to form a metal oxide layer at a temperature of 400° C. or less with oxygen gas and an organometallic source material. Although a metal oxide layer can be formed with oxygen gas and an organometallic source material, the film formation rate is very slow. Thus, in the present embodiment, a method of forming an aluminum oxide layer using oxygen plasma is described. FIG. 1 is a flowchart illustrating an ALD method according to a first embodiment of the present invention.

As shown in FIG. 1, an aluminum oxide ($Al_2O_3$) layer was formed using trimethylaluminum (TMA) as an aluminum source at a substrate temperature of 200° C. at a reactor pressure of 3 torr. To form the aluminum oxide layer, TMA is supplied for 0.2 seconds, argon (Ar) for 0.4 seconds, and oxygen gas ($O_2$) for 0.4 seconds in sequence, and directly followed by oxygen plasma generation for 1 second (Step 103 through 106 of FIG. 1). The sequential pulses of gases and plasma generation for 2 seconds in total are referred to as a cycle. Here, a radio frequency (RF) power of 150 W is applied for 1 second to generate oxygen plasma. The completion of one cycle results in an aluminum oxide layer having a thickness of 1.6 Å.

Figure 2:
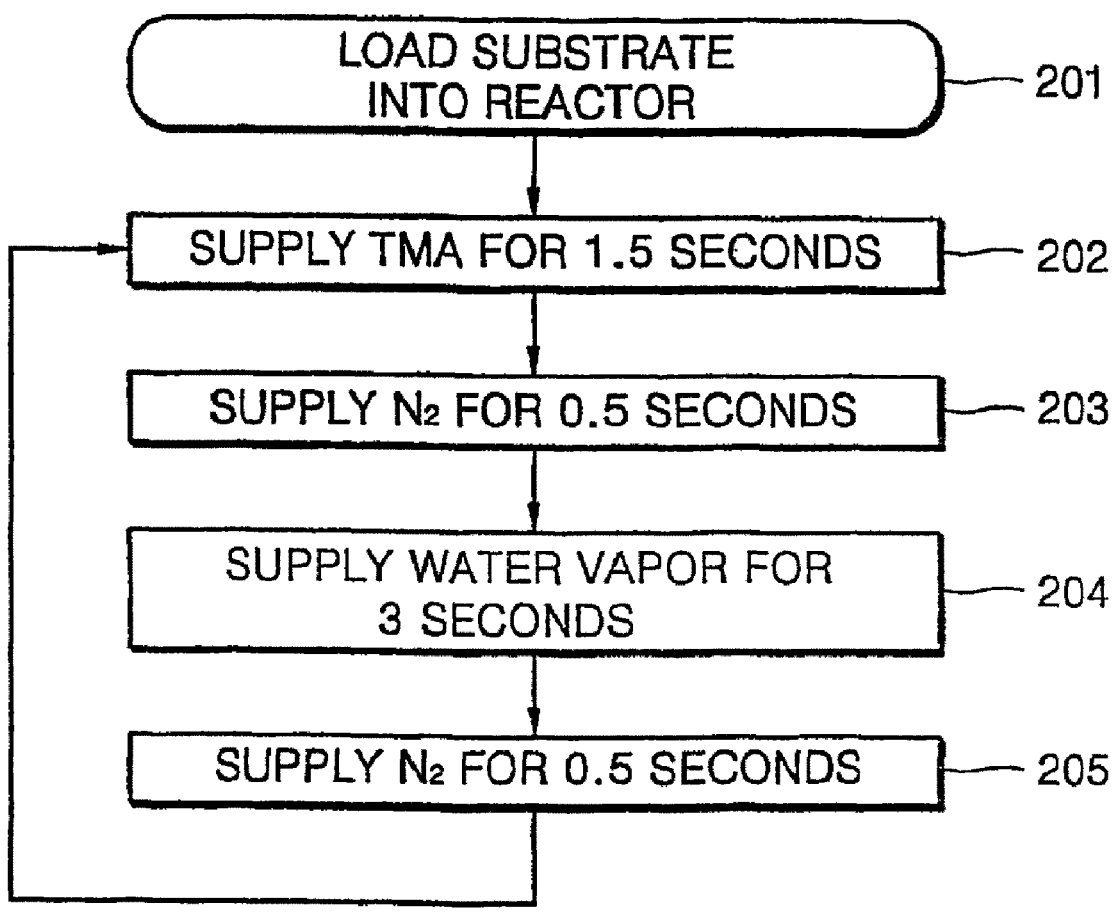
FIG. 2 is a flowchart illustrating a conventional method for forming a metal oxide layer, as a comparative example to the first embodiment of the ALD method according to the present invention.

A conventional ALD method, which is reported in an article entitled "Perfectly Conformal TiN and $Al_2O_3$ films Deposited by Atomic Layer Deposition", Chemical Vapor Deposition, Vol. 5, No. 2, p. 7, 1999 by Ritala et al., is shown in FIG. 2. The conventional method of FIG. 2 for forming an aluminum oxide layer involves, without generation of plasma, supplying TMA (1.5 sec)→$N_2$ (0.5 sec)→$H_2O$ (3.0 sec)→$N_2$ (0.5 sec), which forms a cycle of 5.5 seconds (Steps 202 through 205 of FIG. 1). Here, the completion of one cycle results in an aluminum oxide layer having a thickness of 1.1 Å.

Compared with the conventional method of FIG. 2, the ALD method according to the present invention can form a 46% thicker aluminum oxide layer (1/6 Å/1.1 Å=1.46) per operation cycle. The film formation rate of the ALD method according to the present invention calculated based upon the thickness difference is four times greater compared to the conventional method. Therefore, the ALD method according to the present invention using oxygen gas having low reactivity and oxygen plasma can form an aluminum oxide layer four times faster, compared to the conventional ALD method using highly reactive gases.

Embodiment 2

Figure 3:
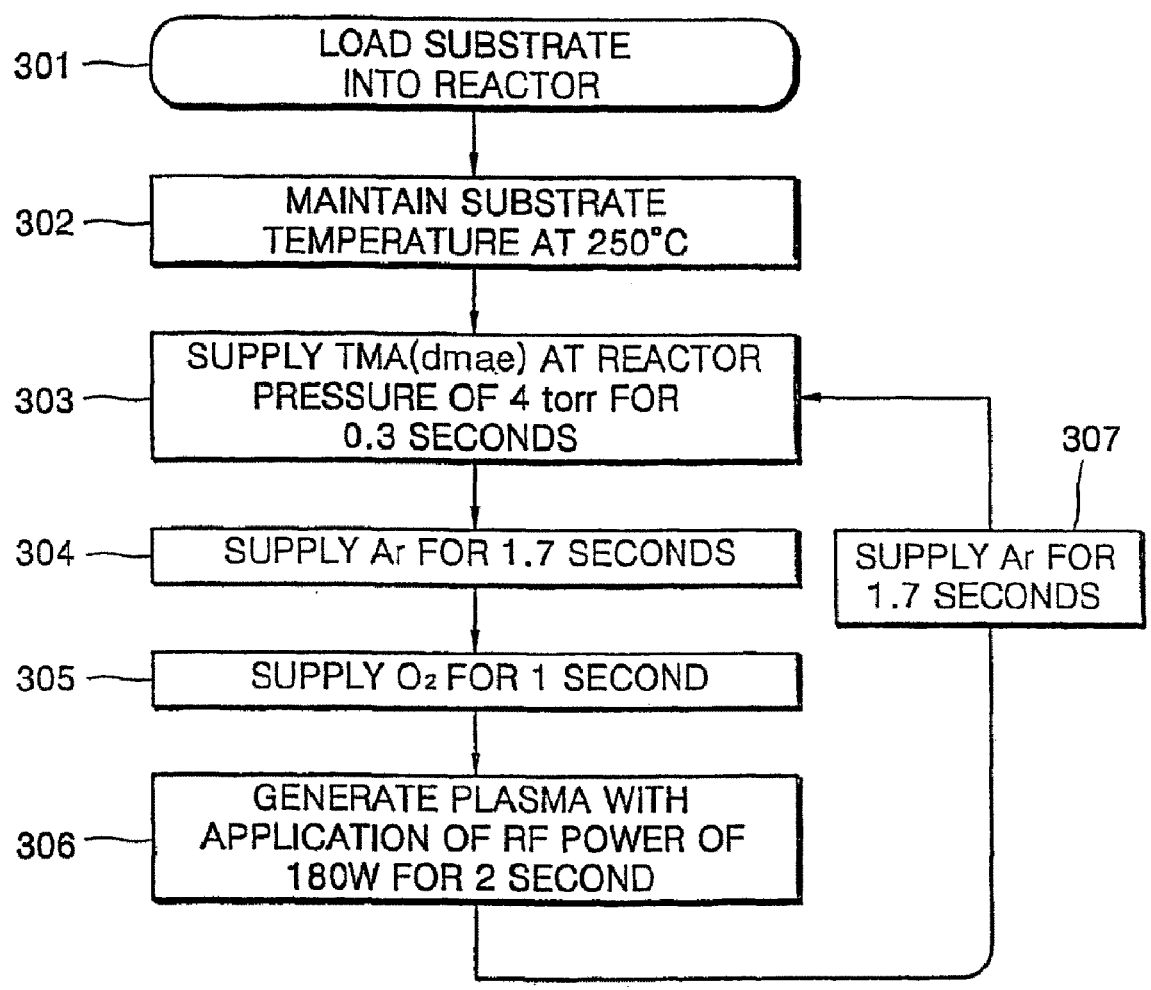
FIG. 3 is a flowchart illustrating an ALD method for forming a tantalum oxide ($Ta_2O_5$) layer according to a second embodiment of the present invention.

FIG. 3 is a flowchart illustrating a second embodiment of an ALD method for forming a tantalum oxide ($Ta_2O_5$) layer according to the present invention. As shown in FIG. 3, a tantalum oxide ($Ta_2O_5$) layer was formed using dimethoxyamidoethyltetraethyltantalum ($Ta(OC_2H_5)_4(OCH_2(CH_2N(CH_3)_2)$, TAE(dmae)) as a tantalum source at a substrate temperature of 250° C. at a reactor pressure of 4 torr. To form the tantalum oxide layer, the sequential processing step of TAE(dmae) (0.3 sec)→Ar(1.7 sec)→$O_2$ (1 sec)→($O_2$+ plasma) (2 sec)→Ar(1 sec) is followed, during which cycle a plasma is generated for 2 seconds with oxygen ($O_2$) gas. The sequential pulses of gases and plasma generation totaling 6 seconds are referred to as a cycle (Step 303 through 307 of FIG. 3). Here, a radio frequency (RF) power of 180 W is applied for 2 seconds in order to generate oxygen plasma. The completion of one cycle resulted in a tantalum oxide layer having a thickness of 0.67 Å.

A conventional ALD method, which is reported in an article entitled "Atomic Layer Epitaxy Growth of Tantalum Oxide Thin Films from ($Ta(OC_2H_5)_5$ and $H_2O$", Journal of Electrochemical Society, Vol. 142, No. 5, p. 1670, 1995 by K. Kukli et al. is shown in FIG. 4. The conventional method of FIG. 4 for forming an tantalum oxide layer involves, without plasma treatment by using the sequential processing step of $Ta(OC_2H_5)_5$(0.2 sec)→$N_2$ (time duration not specified) →$H_2O$ (2.0 sec)→$N_2$ (time duration not specified), which forms a cycle (Steps 402 through 405 of FIG. 4) time of 2.4 seconds or longer. Here, the completion of one cycle resulted in a tantalum oxide layer having a thickness of 0.4 Å.

Since the purging duration of nitrogen into the reactor is not described in the article, the film formation rate per operation cycle cannot be compared accurately with the ALD method according to the present invention. However, from a simple comparison in film thickness between the present invention and the conventional method, it is apparent that the ALD method according to the present invention can form a tantalum oxide layer 68% (0.67/0.4=68%) faster, compared to the conventional ALD method. Therefore, the ALD method according to the present invention using oxygen gas having low reactivity and oxygen plasma can form a tantalum oxide layer 68% faster based upon the thickness of the resulting tantalum oxide layers, compared to the conventional ALD method using highly reactive gases.

Embodiment 3

The present embodiment is directed to a plasma ALD method for forming a strontium titanate ($SrTiO_3$; STO) layer. STO or barium strontium titanate (($Ba,Sr)TiO_3$; BST) has greater dielectric constant so that they are used as a dielectric material for capacitors of highly integrated memory devices such as DRAMs.

A source material $Sr(thd)_2$, where abbreviation "thd" stands for tetramethylheptanedionate, is supplied into a reactor and then the reactor is purged with argon (Ar). Next, oxygen gas is supplied into the reactor to generate plasma and then the reactor is purged again with Ar. $Ti(O-i-Pr)_4$ [or $Ti(O-i-Pr)_2(thd)_2$] is supplied into the reactor, and the reactor is purged again with Ar gas. Next, oxygen gas is supplied into the reactor to generate plasma and then the reactor is purged with Ar. This cycle is repeated one or more times until a STO layer having a desired thickness is obtained.

Embodiment 4

The present embodiment is directed to a plasma ALD method for forming a BST layer. A source material $Ba(thd)_2$ is supplied into a reactor and then the reactor is purged with argon (Ar). Next, oxygen gas is supplied into the reactor to generate plasma and then the reactor is purged again with Ar. This cycle is repeated with $Ti(O-i-Pr)_4$ [or $Ti(O-i-Pr)_2(thd)_2$] and then $Sr(thd)_2$. Next, $Ti(O-i-Pr)_4$ (or $Ti(O-i-Pr)_2(thd)_2$) is supplied again into the reactor and followed by purging with Ar, supply of oxygen to generate oxygen plasma, and then purging with Ar. The cycle of supplying source materials in the sequence of Ba→O→Ti→O→Sr→O→Ti→O is repeated one or more times until a BST layer is formed to a desired thickness. Alternately, the sequence of supplying source materials can be changed to a sequence of Ba→O→Sr→O→Ti→O→Ti→O, or a sequence of Sr→O→Ba→O→Ti→O→Ti→O and then repeated until a BST layer having a desired thickness is formed.

The composition ratio of Ba: Sr:Ti can be varied by repeating an additional cycle of supplying a desired material. For example, for a higher ratio of Ba to Sr, the cycle of supplying source materials in the sequence of Ba→O→Ti→O→Sr→O→Ti→O is extended to further include a sub-cycle of supplying $Ba_6O_6Ti_6O$, thereby forming a BST layer having a desired thickness.

In Embodiments 3 and 4, $Ba(thd)_2$ [or $Sr(thd)_2$] may be dissolved in a solvent such as tetrahydrofuran (THF) or n-butylacetate and then supplied into the reactor through a liquid source supply unit and a vaporizer. In this case, the amounts of source materials supplied during each cycle can be controlled with improved consistency.

Embodiment 5A

A ferroelectric layer such as strontium bismuth tantalate ($SrBi_2Ta_2O_9$; SBT) or lead zirconate titanate ($Pb(Zr,Ti)O_3$; PZT) is used in the manufacture of nonvolatile memory devices capable of retaining data when power is turned off. Formation of a SBT layer will be described in Embodiments 5A and 5B, and formation of a PZT layer will be described in Embodiment 6.

A source material $Sr(thd)_2$ is supplied into a reactor and the reactor is purged with Ar. Next, oxygen gas is supplied into the reactor to generate plasma and the reactor is purged again with Ar. This cycle is repeated with triphenylbismuth ($BiPh_3$) and $Ta(OEt)_5$, respectively. Here, $Ta(OEt)_5$ and $Bi(Ph_3)$ can be replaced with $Ta(OEt)_4(dmae)$ and $Bi(thd)_3$, respectively. The abbreviation "dmae" stands for dimethylaminoetoxide.

Following this, $Bi(thd)_3$ or triphenylbismuth ($BiPh_3$) is supplied into the reactor, and the reactor is purged with Ar. Next, oxygen gas is supplied into the reactor to generate plasma, and the reactor is purged with Ar. Next, this cycle is repeated with $Ta(OEt)_5$ or $Ta(OEt)_4(dmae)$. Here, $Ta(OEt)_5$ can be replaced with $Ta(OEt)_4(dmae)$.

The cycle of supplying source materials in the sequence of Sr→O→Bi→O→Ta→O→Bi→O→Ta→O is repeated one or more times until a SBT layer is formed to a desired thickness. The composition ratio of Sr:Bi:Ta can be varied by further repeating a sub-cycle of supplying a target material during one or more cycles of the source material supply.

Embodiment 5B

In the present embodiment, an ALD method for forming a SBT layer using $Sr[Ta(OEt)_6]_2$ (where Sr:Ta=1:2) or $Sr[Ta(OEt)_5(dmae)]_2$ is disclosed.

$Sr[Ta(OEt)_6]_2$ or $Sr[Ta(OEt)_5(dmae)]_2$ is supplied into a reactor, and the reactor is purged with Ar gas. Next, oxygen gas is supplied into the reactor to generate plasma and followed by purging with Ar gas. Next, $Bi(thd)_3$ or $BiPh_3$ is supplied into the reactor, the reactor is purged with Ar gas, and oxygen gas is supplied into the reactor to generate plasma and followed by purging with Ar gas. The cycle of supplying a bismuth source and oxygen is repeated twice. This cycle of supplying source materials in the sequence of $SrTa_2$→O→Bi→O→Bi→O is repeated one or more times until a SBT layer is formed to a desired thickness. The composition ratio of Sr:Bi:Ta can be varied by further repeating or omitting a sub-step of supplying a bismuth source material during one or more cycles of the source material supply, thereby resulting in a SBT layer having a desired thickness.

In Embodiments 5A and 5B, $Bi(thd)_3$, $BiPh_3$, $Sr[Ta(OEt)_6]_2$, and $Sr[Ta(OEt)_5(dmae)]_2$ may be dissolved in a solvent such as THF or n-butylacetate and then supplied into the reactor through a liquid source supply unit and a vaporizer. In this case, the amounts of source materials supplied during each source material supply cycle can be controlled with improved consistency.

Embodiment 6

A plasma ALD method for forming a PZT layer is disclosed in the present embodiment. $Pb(thd)_2$ is supplied into a reactor, and the reactor is purged with Ar. Next, oxygen gas is supplied into the reactor to generate plasma and followed by purging with Ar. Next, this cycle is repeated with $Zr(O-t-Bu)_4$ [or $Zr(O-t-Bu)_2(thd)_2$] and $Pb(thd)_2$. Finally, $Ti(O-i-Pr)_4$ [$Ti(O-i-Pr)_2(thd)_2$] is supplied into the reactor and followed by purging with Ar, supply of oxygen to generate plasma, and purging with Ar. This cycle of supplying source materials in the sequence of Pb→O→Zr→O→Pb→O→Ti→O is repeated one or more times until a PZT layer is formed to a desired thickness. The composition ratio of Pb:Zr:Ti can be varied by further repeating or omitting a sub-cycle of supplying a particular material source during the source material supply cycle. For example, in the sequential process cycle Pb→O→Zr→O→Pb→O→Ti→O, the sub-cycle Ti→O may be added or subtracted and/or the sub-cycle Zr→O may be added in order to change the ratio of Zr:Ti.

Solid materials such as $Pb(thd)_2$, $Zr(O-t-Bu)_2(thd)_2$, and $Ti(O-i-Pr)_2(thd)_2$ may be dissolved in a solvent such as THF or n-butylacetate and then supplied into the reactor through a liquid source supply unit and a vaporizer. In this case, the amounts of source materials supplied during each source material supply cycle can be controlled with improved consistency.

Embodiment 7A

A zirconium silicate (Zr—Si—O) and hafnium silicate (Hf—Si—O), which have much higher dielectric constant than silicon dioxide ($SiO_2$), are known to be suitable materials for a gate insulating layer for transistors.

In the present embodiment, a plasma ALD method for forming a Zr—Si—O layer is described. t-butoxyzirconium

[Zr(O-t-Bu)$_4$] is supplied into a reactor, and the reactor is purged with Ar. Next, oxygen gas is supplied into the reactor to generate plasma and followed by purging with Ar. Next, tetraethoxysilicon (TEOS) is supplied into the reactor and followed by purging with Ar, supply of oxygen gas to generate plasma, and purging with Ar. This cycle of supplying source materials is repeated one or more times until a Zr—Si—O layer is formed to a desired thickness.

Embodiment 7B

A plasma ALD method for forming a Hf—Si—O layer according to the present invention is disclosed. t-butoxy-hafnium [Hf(O-t-Bu)$_4$] is supplied into a reactor, and the reactor is purged with Ar. Next, oxygen gas is supplied into the reactor to generate plasma and followed by purging with Ar. Next, TEOS is supplied into the reactor and followed by purging with Ar, supply of oxygen gas to generate plasma, and purging with Ar. This cycle of supplying source materials is repeated one or more times until a Hf—Si—O layer is formed to a desired thickness.

Embodiment 8

In the present embodiment, an ALD method for forming an aluminum layer, which is used for metal interconnections in the manufacture of semiconductor devices, using a trialkylaluminum (Al(C$_n$H$_{2n+1}$)$_3$, n=1-6) source material and hydrogen (H$_2$) plasma is disclosed. Suitable trialkylaluminum group materials include trimethylaluminum [Al(CH$_3$)$_3$], triethylaluminum [Al(C$_2$H$_5$)$_3$], and triisobutylaluminum [Al(CH$_2$CH(CH$_3$)$_2$)$_3$]. The higher the temperature at which the aluminum layer is formed, the greater the conductivity of the aluminum layer. Therefore, trimethylammonium having a highest thermal decomposition temperature is preferred for a higher reaction temperature for ALD.

First, trialkylaluminum (Al(C$_n$H$_{2n+1}$)$_3$, n=1-6) is supplied into a reactor, and the reactor is purged with Ar. Next, hydrogen (H$_2$) gas is supplied to generate plasma. Here, plasma can be generated after or while hydrogen gas is supplied. Then, the reactor is purged again with Ar. That is, the sequence of the cycle of supplying source materials is illustrated as:

R$_3$Al→Ar→(H$_2$)→(H$_2$+plasma)→Ar.

Here, hydrogen gas does not react with trialkyaluminum (Al(C$_n$H$_{2n+1}$)$_3$, n=1-6) and thus subsequent purging with Ar can be omitted, thereby reducing time required for each source material supply cycle with improved film formation rate. In this case, after supplying trialkylaluminum (Al(C$_n$H$_{2n+1}$)$_3$, n=1-6) into a reactor, hydrogen gas is supplied into the reactor, and plasma is generated a predetermined time later. Next, the generation is of plasma is stopped, and the supply of the hydrogen gas is cut off immediately or about 1 second later. This cycle of supplying materials and generating plasma is repeated to form an aluminum layer. This operation cycle is illustrated as:

R$_3$Al→H$_2$→(H$_2$+plasma)

or

R$_3$Al→H$_2$→(H$_2$+plasma)→H$_2$      (#1 second)

Embodiment 9A

Aluminum is commonly used for connection of a transistor, capacitor, or resistor in a semiconductor substrate or for power supply to the same. Recently, copper is also used for the same purpose. In this case, when a plasma ALD method is applied to form a copper diffusion barrier layer, such as a TaN layer or a Ta—N—C layer, the electrical conductivity of the copper diffusion barrier layer is increased, compared to other ALD methods not using plasma. For example, compared to an ALD method involving repeatedly supplying an amido compound or amido-imido compound of Ta and ammonia gas (NH$_3$), the ALD method according to the present invention further involving a plasma generation step can produce a diffusion barrier layer for copper with greater electrical conductivity. Alternatively, the electrical conductivity of the diffusion barrier layer for copper can be improved by an ALD method that involves a step of supplying activated nitrogen plasma, instead of the step of supplying ammonia gas.

A Ta—N layer [or a Ta—N—C layer] can be formed by plasma ALD method using t-butylimido-tris(diethylamido) tantalum (TBTDET) as a Ta source. An ALD method carried out by repeatedly supplying source materials in the sequence of TBTDET→Ar→NH$_3$→Ar results in a Ta—N layer [or Ta—N—C layer] having a greater resistivity on the order of 10$^8$ µΩ·cm. In contrast, the plasma ALD method with the operation cycle of TBTDET→Ar→NH$_3$→Ar→(H$_2$+plasma) results in a Ta—N layer [or Ta—N—C layer] is having a much lower resistivity of 4400 µΩ·cm-. In addition, a Ta—N—C layer (containing 15-40% carbon) formed by a plasma ALD method with the operation cycle of TBTDET→H$_2$→(H$_2$+plasma) has a much lower resistivity of 400 µΩ·cm.

Embodiment 9B

A plasma ALD method for forming a titanium nitride layer using tetrakis(dimethylamido)titanium (TDMAT) as a titanium source is disclosed. A TiN layer formed by an ALD method with the operation cycle of TDMAT→Ar→NH$_3$Ar has a resistivity of 1000 µΩ·cm. In contrast, a TiN layer formed by a plasma ALD method with tens to hundreds of repetitions of the cycle of TDMAT→Ar→NH$_3$→Ar→(H$_2$+plasma) has a much lower resistivity of 1800 µΩ·cm.

Embodiment 10

A plasma ALD method for forming a titanium nitride (TiN) layer or a tantalum nitride (TaN) layer using nitrogen (N$_2$) gas, which is almost not reactive, is disclosed. A TiN layer or a TaN layer is deposited using TiCl$_4$ as a titanium source or TaCl$_5$ as a tantalum source at a substrate temperature of 300° C. at a reactor pressure of 5 torr. Here, the cycle of supplying TiCl$_4$ [or TaCl$_5$] (0.2 sec)→(N$_2$+H$_2$) (1.2 sec)→(plasma generation (2.0 sec) is repeated to form the TiN layer or the TaN layer. To supply the gas mixture of N$_2$ and H$_2$ as a reactant gas and purge gas, each of N$_2$ and H$_2$ is supplied at a flow rate of 60 sccm. The plasma is generated with the application of a radio-frequency (RF) power of 150 W (for an 8-inch wafer). The TiN layer [or TaN layer] formed during one operation cycle has a thickness of 0.5 Å. Here, the composition of the TiN layer [or the TaN layer] can be varied by controlling the flow rate of N$_2$ [or H$_2$]. For example, only N$_2$ can be supplied. Alternatively, the content of Ti [or Ta] in the TiN layer [or the TaN layer] can be adjusted by the ratio of H$_2$ in the gas mixture. If the temperature of the substrate is too low during reaction, TiCl$_4$ [or TaCl$_5$] particles are formed by condensation. If the temperature of the substrate is too high, it is undesirable for interconnect materials. Therefore, it is preferable to maintain the substrate temperature during reaction within the range of 150-500° C. It is preferable that the reactor pressure is in the range of 0.5-10 torr with a RF power of 0.01-2.0 W/cm$^2$ for plasma generation.

Embodiment 11

Metals such as aluminum (Al) are used for connection of a semiconductor devices, capacitors, and resistors on a silicon substrate or for power supply to the same. Recently, copper is also used for the same purpose. In this case, a diffusion barrier layer, such as a TiN or TaN layer, for blocking diffusion of copper atom into an insulating layer is required. The TiN or TaN layer has poor adhesion to copper. Therefore, a method for depositing a diffusion barrier layer without this problem is disclosed in the present embodiment.

A halogen gas such as Ti [or Ta], or an organometallic compound is supplied into a reactor, and the rector is purged with Ar. Ammonia or nitrogen gas is supplied into the reactor and followed by generation of plasma and purging with Ar. This cycle is repeated until a TiN [or TaN] layer is formed to be thick enough to prevent diffusion of copper atom into the insulating layer. Following this, (hfac)Cu$^{+1}$ (vtms) [or Cu(hfac)$_2$] is supplied into the reactor and followed by purging with Ar. Hydrogen gas is supplied into the reactor to discharge plasma and followed by purging with Ar, thereby forming a copper layer on the surface of the substrate. As a result, an Al layer with good adhesion to a copper layer can be formed by this method.

Embodiment 12

A plasma ALD method for forming a copper diffusion barrier layer with improved adhesion to a copper layer is disclosed. First, a TiN layer [or a TaN layer] is formed to be thick enough for blocking diffusion of copper atoms by repeating the operation cycle for the TiN layer [or TaN layer]. Here, the processing sub-cycle for forming a metallic layer with good adhesion is repeated during the processing cycle of forming the TiN layer or [TaN layer]. For example, a sub-cycle including two runs of the supply cycle of Ti [or Ta]→Ar→N→Ar and a single run of the supply cycle of Cu [or Al]→Ar→H→Ar is repeated twice. Next, another sub-cycle including a single run of the supply cycle of Ti [or Ta]→Ar →N→Ar and a single run of the supply cycle of Cu [or Al]→Ar→H→Ar is repeated twice. Then, another sub-cycle including a single run of the supply cycle of Ti [or Ta]→Ar →N→Ar and two runs of the supply cycle of Cu [or Al]→Ar→H→Ar is repeated twice. Finally, the supply cycle of Cu [or Al]→Ar→H→Ar is repeated three times. By forming the TiN [or TaN] layer as a diffusion barrier layer with a gradually varying composition profile, improved adhesion between the diffusion barrier layer and a copper interconnect layer has been obtained as a result.

Embodiment 13

A plasma ALD method for forming a titanium (Ti) layer or a tantalum (Ta) layer, in which plasma is generated in synchronization with the cycle of pulsing source materials, is disclosed. Here, a Ti layer [or a Ta layer] is formed using TiCl$_4$ as a titanium source [or TaCl$_5$] as a tantalum source at a substrate temperature of 300° C. and at a reactor pressure of 5 torr. Here, the processing cycle of supplying TiCl$_4$ [TaCl$_5$] (0.2 sec)→H$_2$ (1.9 sec)→(plasma generation) (2.0 sec) is repeated to form the TiN layer [or the TaN layer]. The plasma is generated with the application of a radio-frequency (RF) power of 150 W (for an 8-inch wafer). Although H$_2$ is used as a reactant gas and purge gas in the present embodiment, a mixture with an inert gas such as helium (He) or Ar can be used for purging efficiency. If the temperature of the substrate is too low during reaction, TiCl$_4$ or TaCl$_5$ particles are formed by condensation. If the temperature of the substrate is too high, it is undesirable for interconnect materials. Therefore, it is preferable to maintain the substrate temperature during reaction within the range of 150-500° C. It is preferable that the reactor pressure is in the range of 0.5-10 Torr with a RF power of 0.01-2.0 W/cm$^2$ for plasma generation.

Embodiment 14

A plasma ALD method for forming a tungsten (W) layer, in which plasma is generated in synchronization with the cycle of pulsing source materials, is disclosed. Here, a W layer is formed using WF$_6$ as a tungsten source at a substrate temperature of 300° C. and at a reactor pressure of 5 torr. Here, the processing cycle of WF$_6$ (1.0 sec)→(H$_2$+Ar) (6.0 sec)→ (plasma generation) (2.0 sec) is repeated to form the W layer. Here, WF$_6$ is supplied at a flow rate of 2 sccm, and N$_2$ and Ar gases used as a reactant gas and a purge gas, respectively, are supplied at a flow rate of 100 sccm, respectively. The plasma is generated at a radio-frequency (RF) power of 100 W (for an 8-inch wafer). It is preferable to maintain the substrate temperature during reaction within the range of 100-450° C. It is preferable that the reactor pressure is in the range of 0.5-10 torr with a RF power of 0.01-2.0 W/cm$^2$ for plasma generation.

Embodiment 15

A plasma ALD method for forming a tungsten nitride (WN) layer, in which plasma is generated in synchronization with the cycle of pulsing source materials, is disclosed. Here, a WN layer is formed using WF$_6$ as a tungsten source at a substrate temperature of 300° C. and at a reactor pressure of 5 torr. Here, the processing cycle of WF$_6$ (1.0 sec)→(H$_2$+N$_2$) (6.0 sec)→(plasma generation) (2.0 sec) 6 (H$_2$+N$_2$) (1 sec) is repeated to form the WN layer. Here, WF$_6$ is supplied at a flow rate of 2 sccm, and N$_2$ and H$_2$ gases used as a reactant gas and a purge gas are supplied at a flow is rate of 100 sccm and 50 sccm, respectively. The plasma is generated at the radio-frequency (RF) power of 100 W (for an 8-inch wafer). Here, the composition of the WN layer can be varied by adjusting the flow rate of N$_2$ [or H$_2$]. Only N$_2$ can be supplied without H$_2$. The content of W in the WN layer can be varied by adjusting the ratio of H$_2$ in the gas mixture. It is preferable to maintain the substrate temperature during reaction within the range of 100-450° C. It is preferable that the reactor pressure is in the range of 0.5-10 torr with a RF power of 0.01-2.0 W/cm$^2$ for plasma generation.

While this invention has been particularly shown and described with reference to preferred embodiments thereof, it will be understood by those skilled in the art that various changes in form and details may be made therein without departing from the spirit and scope of the invention as defined by the appended claims.

We claim:

1. A method for forming a metal-containing layer on a substrate in a reactor of an atomic layer deposition (ALD) apparatus, the method comprising a plurality of ALD cycles of sequential reactant pulses, the cycles comprising:

pulsing a first metallic source compound into the reactor;

supplying a reactant gas into the reactor without generating a plasma, where the reactant gas does not react with the first metallic source compound in the absence of plasma; and generating a plasma directly in the reactor while continuing to supply the reactant gas into the reactor; and repeating pulsing the first metallic source compound, supplying the reactant gas and generating the plasma directly in the reactor until the metal-containing layer is formed to a desired thickness.

2. The method of claim 1, wherein the metallic source compound comprises an organometallic compound.

3. The method of claim 1, wherein generating the plasma is conducted in each of the cycles.

4. The method of claim 1, wherein generating the plasma is conducted after several cycles of supplying the metallic source compound.

5. The method of claim 1, wherein the reactant gas comprises $O_2$ and the metal-containing layer comprises a metal oxide layer.

6. The method of claim 5, wherein the first metallic source compound is trimethylaluminum ($Al(CH_3)_3$), and the metal oxide layer is an aluminum oxide ($Al_2O_3$) layer.

7. The method of claim 5, wherein the first metallic source compound is dimethoxyamidoethoxytetraethoxytantalum ($Ta(OC_2H_5)_4(OC_2H_4N(CH_3)_2)$) or ethoxytantalum ($Ta(OC_2H_5)_5$), and the metal-containing layer is a tantalum oxide ($Ta_2O_5$) layer.

8. The method of claim 5, wherein one or more of the ALD cycles further comprises pulsing a second metallic source compound into the reactor, wherein the metal-containing layer comprises a complex metal oxide layer.

9. The method of claim 8, further comprising:
supplying the $O_2$ reactant gas into the reactor without generating a plasma after pulsing the second metallic source compound;
generating a plasma directly in the reactor while continuing to supply the $O_2$ reactant gas; and
repeating pulsing the first metallic source compound, supplying the $O_2$ reactant gas, generating the plasma, pulsing the second metallic source compound, supplying the $O_2$ reactant gas and generating the plasma until the metal-containing layer is formed to the desired thickness.

10. The method of claim 8, wherein the first metallic source compound comprises strontium, the second metallic source compound comprises titanium, and the complex metal oxide layer comprises strontium titanate (STO).

11. The method of claim 8, wherein one or more of the ALD cycles further comprises pulsing a third metallic source compound into the reactor, wherein the complex metal oxide layer comprises at least three kinds of metals.

12. The method of claim 11, wherein one of the metallic source compounds comprises barium, another of the metallic source compounds comprises titanium, another of the metallic source compounds comprises strontium, and the complex metal oxide layer comprises barium strontium titanate (BST).

13. The method of claim 11, wherein one of the metallic source compounds comprises strontium, another of the metallic source compounds comprises bismuth, another of the metallic source compounds comprises tantalum, and the complex metal oxide layer comprises strontium bismuth tantalate (SBT).

14. The method of claim 13, wherein a ratio of strontium-containing metallic source compound pulses to tantalum-containing metallic source compound is about 1:2.

15. The method of claim 11, wherein one of the metallic source compounds comprises lead, another of the metallic source compounds comprises zirconium, another of the metallic source compounds comprises titanium, and the complex metal oxide layer comprises lead zirconium titanate (PZT).

16. The method of claim 8, wherein the first metallic source compound comprises bismuth, the second metallic source compound comprises strontium and tantalum in a ratio of 1:2, and the complex metal oxide layer comprises strontium bismuth tantalate (SBT).

17. The method of claim 5, wherein one of more of the ALD cycles further comprises pulsing a silicon-based compound into the reactor.

18. The method of claim 17, wherein the first metallic source compound comprises zirconium and the metal oxide layer comprises zirconium silicate (Zr—Si—O).

19. The method of claim 17, wherein the first metallic source compound comprises hafnium and the metal oxide layer comprises hafnium silicate (Hf—Si—O).

20. The method of claim 1, wherein the reactant gas comprises hydrogen and the metal-containing layer comprises a metal layer.

21. The method of claim 20, wherein the reactant gas further comprises an inert gas.

22. The method of claim 20, wherein first metallic source compound comprises a trialkylaluminum ($Al(C_nH_{2n+1})_3$, n=1-6) and the metal layer comprises an aluminum layer.

23. The method of claim 20, wherein the first metallic source compound comprises titanium tetrachloride ($TiCl_4$) and the metal layer comprises a titanium layer.

24. The method of claim 23, wherein, during formation of the titanium layer, the temperature of a substrate in the reactor is maintained at 150-500° C., the inside of the reactor is maintained at a pressure of 0.5-10 torr, and an RE power of 0.01-2.0 W/cm$^2$ is applied to generate the plasma.

25. The method of claim 20, wherein the first metallic source compound comprises tungsten hexafluoride ($WF_6$) and the metal layer comprises a tungsten layer.

26. The method of claim 25, wherein, during deposition of the tungsten layer, the temperature of a substrate in the reactor is maintained at 100-450° C., the inside of the reactor is maintained at a pressure of 0.5-10 torr, and an RF power of 0.01-2.0 W/cm$^2$ is applied to generate the plasma.

27. The method of claim 20, wherein the first metallic source compound comprises tantalum pentachloride ($TaCl_5$) and the metal layer comprises a tantalum layer.

28. The method of claim 27, wherein, during deposition of the tantalum layer, the temperature of a substrate in the reactor is maintained at 150-500° C., the inside of the reactor is maintained at a pressure of 0.5-10 torn and an RE power of 0.01-2.0 W/cm$^2$ is applied to generate the plasma.

29. The method of claim 1, wherein the reactant gas comprises nitrogen and the metal-containing layer comprises a metal nitride layer.

30. The method of claim 1, wherein the reactant gas comprises a gas mixture of nitrogen and hydrogen and the metal-containing layer comprises a metal nitride.

31. The method of claim 30, wherein the first metallic source material is titanium tetrachloride ($TiCl_4$), and the metal nitride layer is a titanium nitride (TiN) layer.

32. The method of claim 31, wherein, during deposition of the titanium nitride layer, the temperature of the substrate in the reactor is maintained at 150-500° C., the inside of the reactor is maintained at a pressure of 0.5-10 Torr, and an RF power of 0.01-2.0 W/cm$^2$ is applied to generate the plasma.

33. The method of claim 30, wherein the first metallic source compound is tantalum pentachloride ($TaCl_5$), and the metal nitride layer is a tantalum nitride (TaN) layer.

34. The method of claim 1, wherein the reactant gas comprises hydrogen gas, further comprising pulsing ammonia gas between pulsing the first metallic source compound and generating the plasma, wherein the metal-containing layer comprises a highly conductive metal nitride layer.

35. The method of claim 1, wherein the first metallic source compound comprises a tantalum based organometallic compound, the reactant gas comprises hydrogen and the metal-containing layer comprises tantalum nitride carbide layer.

36. The method of claim 1, wherein supplying the reactant gas further comprises supplying an inert gas.

37. The method of claim 1, further comprising supplying an inert gas into the reactor between pulsing the first reactant and supplying the reactant gas.

38. The method of claim 1, further comprising varying ratios of pulses of the first, second and third metallic source components over time to form the metal-containing layer with a graded composition profile.

39. The method of claim 1, wherein a rate of forming the metallic layer per ALD cycle is faster than an ALD method using a metallic source compound and a reactive gas in the absence of plasma, where the reactive gas is more reactive than the reactant gas.

* * * * *

UNITED STATES PATENT AND TRADEMARK OFFICE
CERTIFICATE OF CORRECTION

PATENT NO. : 7,485,349 B2  Page 1 of 1
APPLICATION NO. : 11/552898
DATED : February 3, 2009
INVENTOR(S) : Won-Yong Koh and Chun-soo Lee It is certified that error appears in the above-identified patent and that said Letters Patent is hereby corrected as shown below:

In Col. 5, line 62, please change "(1/6" to --(1.6--.

In Col. 10, line 35 (approx.), please change NH$_3$Ar" to --NH$_3$ → Ar--.

In Col. 14, line 29 (approx.), Claim 24, please change "RE" to --RF--.

In Col. 14, line 46 (approx.), Claim 28, please change "torn" to --torr--.

In Col. 14, line 46 (approx.), Claim 28, please change "RE" to --RF--.

Signed and Sealed this

Second Day of June, 2009

JOHN DOLL
*Acting Director of the United States Patent and Trademark Office*